(12) United States Patent
Zhuang et al.

(10) Patent No.: US 9,524,997 B1
(45) Date of Patent: Dec. 20, 2016

(54) SEMICONDUCTOR DEVICE HAVING SEAL RING

(71) Applicant: TAIWAN SEMICONDUCTOR MANUFACTURING CO., LTD., Hsinchu (TW)

(72) Inventors: Zhi-Wei Zhuang, Hsinchu County (TW); Chung-Chuan Tseng, Hsinchu (TW); Chia-Wei Liu, Hsinchu County (TW); Li-Hsin Chu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/887,886

(22) Filed: Oct. 20, 2015

(51) Int. Cl.
*H01L 31/00* (2006.01)
*H01L 27/146* (2006.01)

(52) U.S. Cl.
CPC ....... *H01L 27/1462* (2013.01); *H01L 27/1463* (2013.01); *H01L 27/14625* (2013.01); *H01L 27/14632* (2013.01); *H01L 27/14636* (2013.01); *H01L 27/14643* (2013.01); *H01L 27/14687* (2013.01)

(58) Field of Classification Search
None
See application file for complete search history.

(56) References Cited

U.S. PATENT DOCUMENTS

| | | | |
|---|---|---|---|
| 2011/0186951 A1* | 8/2011 | Pyo | H01L 23/481 257/432 |
| 2012/0038028 A1* | 2/2012 | Yaung | H01L 23/585 257/620 |
| 2014/0077320 A1* | 3/2014 | Chen | H01L 27/1464 257/431 |
| 2014/0124889 A1* | 5/2014 | Qian | H01L 27/14618 257/448 |

* cited by examiner

*Primary Examiner* — Reema Patel
(74) *Attorney, Agent, or Firm* — Maschoff Brennan

(57) ABSTRACT

A semiconductor device includes a thermal conductor formed on and thermally connected to the seal ring. The thermal conductor is spatially spaced from the electrically conductive pad. The thermal conductor is exposed of the substrate and can be regarded as an extension of the thermal path of the seal ring, such that the heat from the seal ring is dissipated efficiently.

20 Claims, 9 Drawing Sheets

SEMICONDUCTOR DEVICE HAVING SEAL RING

BACKGROUND

Semiconductor devices are used in a variety of electronic applications, such as personal computers, cell phones, digital cameras, and other electronic equipment, as examples. Semiconductor devices are fabricated by sequentially depositing insulating or dielectric layers, conductive layers, and semiconductor layers of material over a semiconductor substrate, and patterning or processing the substrate and/or the various material layers using lithography to form circuit components and elements thereon. Dozens or hundreds of integrated circuits are manufactured on a single semiconductor wafer. The individual dies are singulated by sawing the integrated circuits along a scribe line. The individual dies are then packaged separately, in multi-chip modules, in other types of packaging, or used directly in an end application, for example.

Integrated circuit dies are formed on a front side of semiconductor wafers. The integrated circuit dies may comprise various electronic components, such as transistors, diodes, resistors, capacitors, and other devices. The integrated circuit dies may have various functions, such as logic memory, processors, and/or other functions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
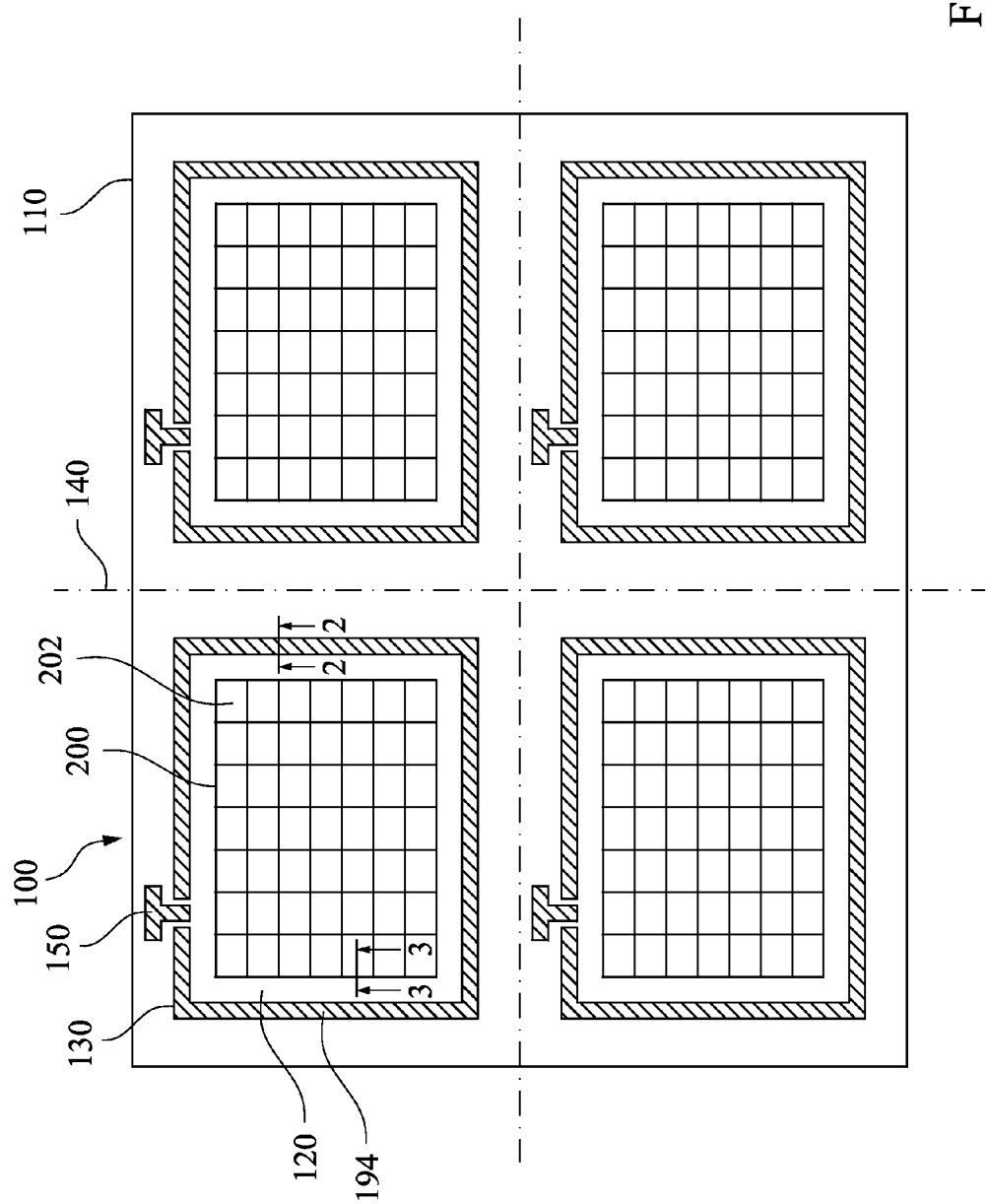
FIG. 1 is a top view of a semiconductor device, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits generally include semiconductor devices and passive components manufactured on a surface of a substrate of semiconductor material. Generally, multiple integrated circuits are fabricated simultaneously on a semiconductor wafer. One or more individual integrated circuits are segregated from other integrated circuits by die saw cut lines, such as scribe lines. In this way, the semiconductor wafer is cut along the die saw cut lines once fabrication is complete to separate individual integrated circuits from one another, or rather to separate individual die from one another where multiple integrated circuits can be formed upon respective die. During sawing, the uppermost surfaces of integrated circuits are generally protected by of a passivation layer. However, the passivation layer cannot cover the periphery of the integrated circuits. Accordingly, one or more seal rings are formed around the periphery of the integrated circuits as part of the fabrication of the integrated circuits prior to sawing. The seal ring includes a plurality of conductive layers arranged among a plurality of dielectric layers. The seal ring provides structural reinforcement for the integrated circuits during sawing.

FIG. 1 is a top view of a semiconductor device, in accordance with various embodiments of the present disclosure. The semiconductor structure includes one or more semiconductor device 100. In some embodiments, each of the semiconductor devices 100 is formed in a wafer 110. One or more array regions 200 are formed on the wafer 110. At least one seal ring 130 is formed in the dielectric layer 102 and arranged around the array region 200. A periphery region 120 is present between the array region 200 and the seal ring 130.

For example, the array region 200 includes one or more circuits configured to have driving function, a sensing function, etc. Because the wafer 110 is fabricating to include multiple semiconductor devices 100 thereon, at least some of the one or more semiconductor devices 100 are segregated by die saw cut lines 140. As the wafer 110 is sawed by a die saw process, conductive debris and moisture can contaminate the one or more semiconductor devices 100, which can result in electrical shorts. Also, mechanical stress from sawing can result in cracks, fractures or other damage to at least some of the one or more semiconductor devices 100. Accordingly, the seal ring 130 is formed within the wafer 110 and surrounding the array region 200 before sawing to mitigate such issues.

The seal ring 130 provides structural reinforcement for the one or more semiconductor devices 100 during sawing.

The seal ring 130 also mitigates conductive debris and undesirable moisture from entering active of the one or more semiconductor device 100.

The semiconductor device 100 further includes one or more electrically conductive pads 150 formed on the wafer 110. In some embodiments, the electrically conductive pad 150 is electrically connected to the components of the array region 200. Thus, the components in the array region 200 are electrically connected to the external circuit through the electrically conductive pad 150.

Figure 2:
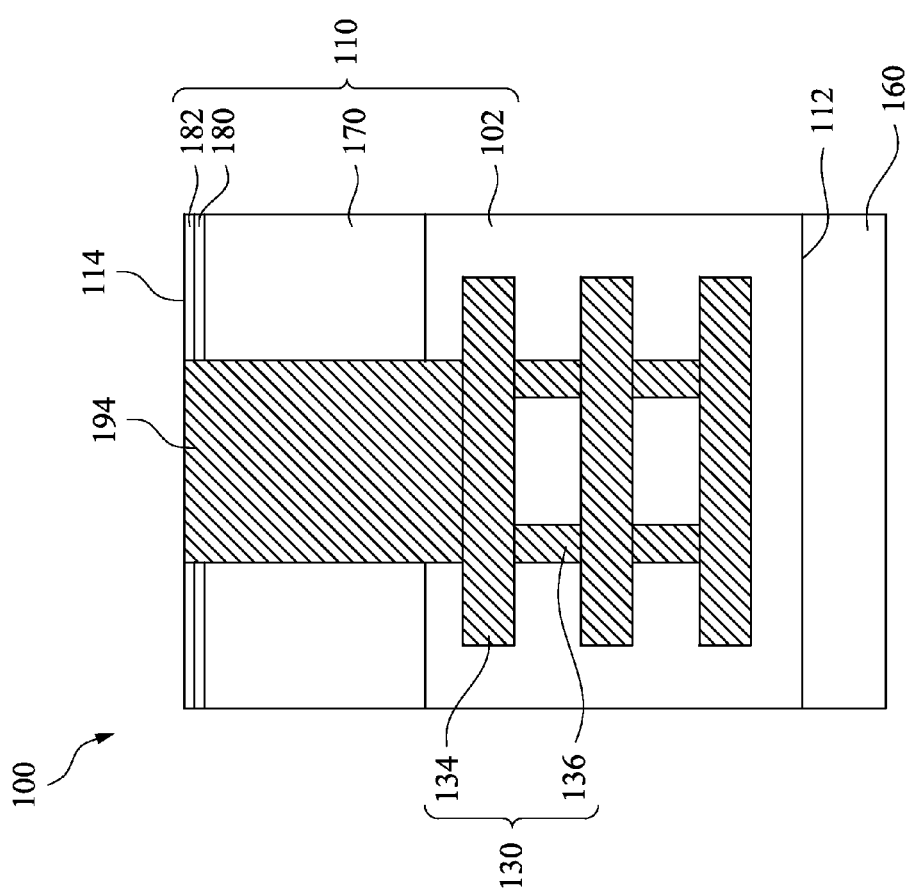
FIG. 2 is a partial cross-sectional view of the semiconductor device, in accordance with some embodiments of the disclosure.

Reference is made to FIG. 2, which is a partial cross-sectional view of the semiconductor device 100 taken along line 2-2 of FIG. 1. The wafer 110 includes a device substrate 170, such as a bulk silicon substrate. The device substrate 170 may be silicon in a crystalline structure. In other some embodiments, the device substrate 170 may include other elementary semiconductors such as germanium, or include a compound semiconductor such as, silicon carbide, gallium arsenide, indium arsenide, and indium phosphide.

The wafer 110 has a first surface 112 and a second surface 114 opposite to each other. The wafer 110 includes a device substrate 170 and a dielectric layer 102 forming on the device substrate 170. (Note that while the first surface 112 of the wafer 110 is depicted facing downwards in the figures, the position of the substrate and the overlying layers is arbitrary in the figures, and rotating the semiconductor device 100 does not change the functions and relative positions of the elements shown. As depicted in the figures, the second surface 114 of the wafer 110 is shown oriented facing upwards; however, this does not change which portion is the back side of the semiconductor device 100, even when the orientation is different.)

The seal ring 130 is embedded in the dielectric layer 102. The seal ring 130 includes a plurality of conductive layers 134 formed in the dielectric layer 102. The dielectric layer 102 may be made of silicon oxide, carbon doped oxide, fluorinate amorphous carbon, hydrogenated amorphous carbon, hydrogenated silsesquioxane, poly (arylene ethers), cyclotene, silicone oxide aerogel or silicone oxide xerogel. Furthermore, the dielectric layer 102 may be formed by spin coating or chemical vapor deposition.

The conductive layers 134 are arranged in the dielectric layer 102. At least some of the plurality of conductive layers 134 are electrically coupled to one another by one or more vias, such as via 136. That is, a via 136 electrically couples at least two conductive layers 134 to one another through the dielectric layers 102. The conductive layers 134 and the vias 136 can be made of copper or tungsten. The conductive layers 134 and the vias 136 can be formed by a deposition process.

The wafer 110 having the array region and the seal ring 130 thereon may be fastened on and supported by a carrier substrate 160. The carrier substrate 160 may be any semi-rigid amorphous or crystalline material or composite. The carrier substrate 160 may be a wafer having circuits or components thereon.

The dielectric layer 102 is formed on the device substrate 170, and then the wafer 110 is reversed upside down when the wafer 110 is placed on the carrier substrate 160. The semiconductor substrates 170 may include any suitable material and structures. The device substrate 170 may include trenches and the STI dielectric material filled in the trenches. The STI dielectric material utilized in the device substrate 170 can be oxide, for example. The semiconductor substrate 170 may includes one or more semiconductor components surrounded by the seal ring 130.

The wafer 110 further includes at least one passivation layer formed on the device substrate 170. In some embodiments, the wafer 110 includes a first passivation layer 180 formed on the device substrate 170, and a second passivation layer 182 formed on the first passivation layer 180. The passivation layers 180, 182 and the dielectric layer 102 are formed at opposite sides of the semiconductor substrate. The first passivation layer 180 and the second passivation layer 182 are made of different materials. In some embodiments, the first passivation layer 180 is made of an oxide material, a nitride material, and oxide nitride material, etc. In some embodiments, the second passivation layer 182 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide ($SiO_2$).

Reference is made back to FIG. 1. The array region 200 is formed at a substantially center region of the semiconductor device 100. The array region 200 is surrounded by the seal ring 130, and the periphery region 120 is defined between the seal ring 130 and the array region 200. The array region 200 includes a plurality of integrated circuit components formed therein. In some embodiments, the plurality of components in the array region 200 includes a plurality of pixels 202, when the semiconductor device 100 is an image sensor device.

In some embodiments, the semiconductor device 100 a complementary metal oxide semiconductor (CMOS) image sensor (CIS), for example. In some embodiments, the semiconductor device 100 is a back side illumination (BSI) image sensor (also referring as BSI image sensor 100). The BSI image sensor 100 may be an integrated circuit including the array including photodiodes. Each of the photodiode may include a photosensitive diode (p-n junction) and associated transistors for receiving signals proportional to the intensity or light received by the photosensitive diodes during a light sampling interval. Circuitry for providing functions other than photodiodes, such as input output buffers and logic circuitry, may be formed in the periphery region 120. This additional circuitry may include logic circuitry for operating the sensor array and circuitry for communicating the data corresponding to the sensed light to external devices. The periphery region 120 is positioned adjacent to the array region 200.

Figure 3:
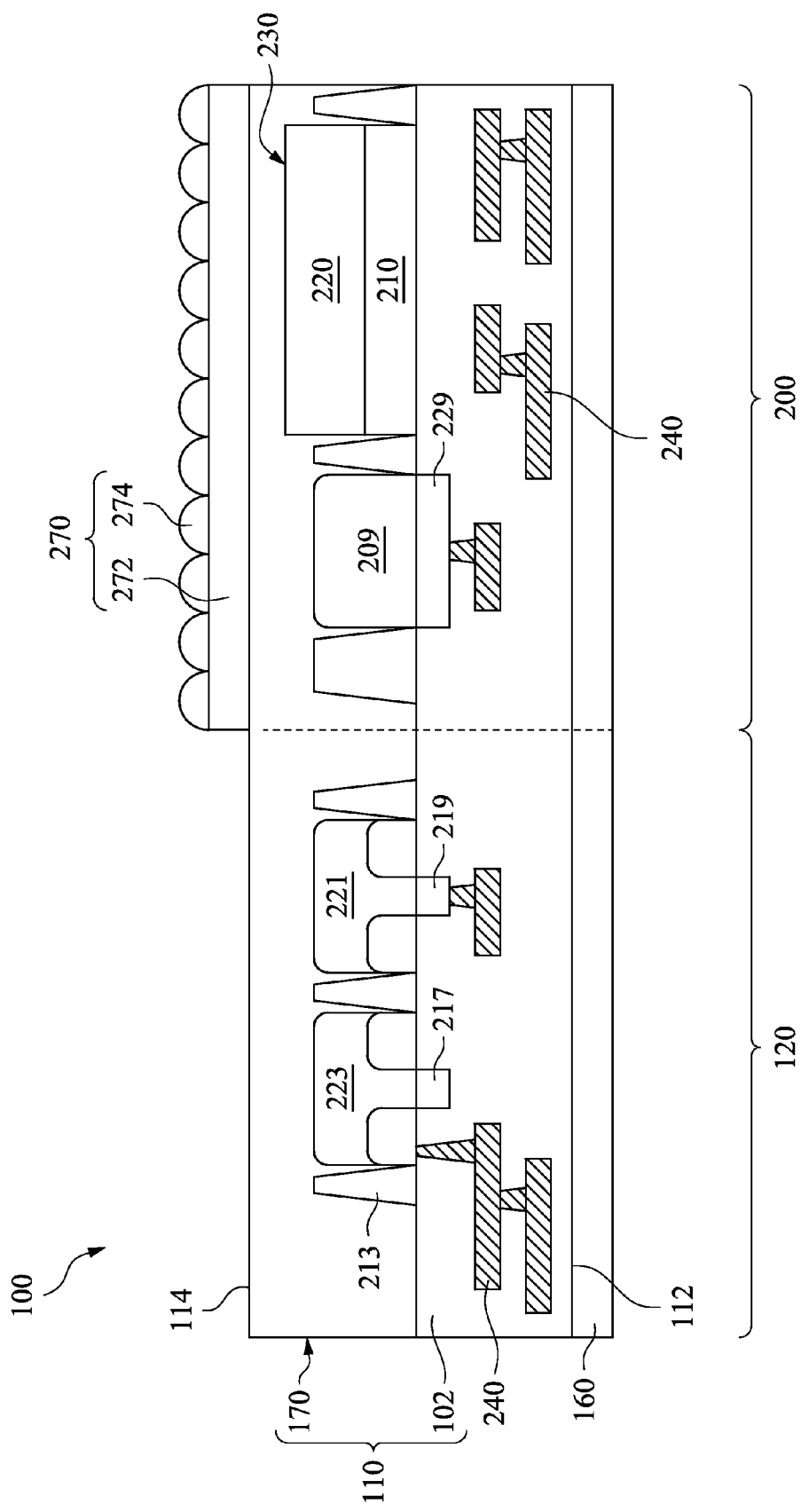
FIG. 3 is a partial cross-sectional view of the semiconductor device, in accordance with some embodiments of the disclosure.

Reference is made to FIG. 3, which is a partial cross-sectional view taken along line 3-3 of FIG. 1. The semiconductor device 100 may be a back side illumination (BSI) image sensors such as BSI CMOS image sensors are popular because of their compatibility with CMOS manufacturing processes, low cost, small size, and high performance. CMOS image sensors are replacing more charge coupled device (CCD) sensors due to certain advantages, including that CMOS image sensors consume less power, are compatible with CMOS semiconductor processes, and the sensors may be integrated with additional CMOS logic devices on a single integrated circuit device.

In forming a BSI image sensor, semiconductor processing is used to form an array of photodiodes (PDs) and the associated MOS transfer transistors in a sensor array for integrated circuit dies on a semiconductor wafer, and to form periphery circuit such as input-output buffers in the integrated circuit dies on the semiconductor wafer. As the photodiodes are exposed to receive light, an electrical charge is induced in the photodiodes corresponding to the light intensity. The MOS transfer transistor may sample the charge and transfer charge to a storage node for further processing. Color pixels may be formed by placing color filters over the light sensitive CMOS circuitry.

In some embodiments, the semiconductor device 100, such as an image sensor device may include hundreds or thousands of photodiodes in array region 200. Further, the semiconductor device 100 is formed on a semiconductor wafer that may include many hundreds or thousands of BSI integrated circuit devices arranged as individual dies on each semiconductor wafer. Processing steps and details not necessary to understanding the embodiments are omitted herein for clarity.

In the intermediate processing stage, shown in the cross section of FIG. 3, the wafer 110 is processed to include the array region 200 and a periphery region 120, the manufacture and function of which will be clear to those skilled in the art.

In FIG. 3, the wafer 110 has a first surface 112 and a second surface 114 opposite to each other. The wafer 110 includes a device substrate 170 and a dielectric layer 102 formed on the device substrate 170. The wafer 110 is reversed upside down when the wafer 110 is placed on the carrier substrate 160 after the semiconductor device is formed. The device substrate 170 is made of a semiconductor material such as silicon, germanium, and diamond or like materials. Compound materials used for semiconductor substrates such as silicon germanium, silicon carbide, gallium arsenide, indium arsenide or indium phosphide, and combinations of these, may be used.

The wafer 110 has been processed using front end of the line (FEOL) processes to form a photodiode 230 including a first diffusion region 210 and a second diffused region 220 in the array region 200, in which the photodiode 230 is formed in the device substrate 170. Diffused regions 221 and 223 in the periphery region 120 form doped wells that may be used, for example, to form CMOS logic transistors in the periphery region 120. Isolation structures 213 are shown between the diffused regions; these may be shallow trench isolation (STI) or LOCOS isolation. Gate structures 217, 219, and 229 may be formed as patterned gate conductors overlying the diffused regions including a gate dielectric and a conductor, and may be formed of a doped polysilicon material for example, or by using metal gate processes. The gate dielectric material (not visible) may be silicon dioxide, or high or low-k gate dielectric material. Diffused region 209 and gate 229 may form a photodiode transfer transistor in the array region 200. The transfer transistor may be used for transferring charge corresponding to the light sensed by the photodiode 230 during a sampling interval into a storage node (not shown), for example. The first diffusion region 210 is formed of one doping type, such as an n-type, and the second diffusion region 220 is formed of an opposing doping type, such a p-type, to form a p-n junction for a photodiode 230. The array region 200 may also include pixel circuitry such as transfer gate 229, and in addition reset transistors, source follower transistors, and read select transistors for each photo detector may be formed in the array region 200.

A plurality of conductive layers are formed in the dielectric layer 102 for interconnection. At least one of the inter-connecting structures 240 is electrically connected to the transistors in the array region 200 and the periphery region 120. The conductive layers of the seal ring can be formed with the processes of forming the inter-connecting structure 240. In some embodiments, the seal ring itself is electrically isolated from the array region 200.

The semiconductor device 100 further includes an optical structure 270 formed on the second surface 114 of the device substrate 170. The light enters the semiconductor device 100 through optical structure 270 to the photodiodes 230, and the current generated by the photodiodes 230 is transmitted to the inter-connecting structure 240, which are arranged opposite to the optical structure 270. The optical structure 270 includes a color filter 272 formed on the device substrate 170 and a plurality of lenses 274 formed on the color filter 272. The color filter 272 selectively passes light of certain frequencies which may include red, green and blue colors (R/G/B) to create color pixels. The lenses 274 are formed on the color filter 272 to further improve the light reception. The semiconductor device 100 may further include one or more passivation layers 180, 182 formed at the second side of the wafer 110.

In some embodiments, the seal ring (see FIG. 2) is utilized as a heat sink for dissipating heat generated from the array region 200. However, the BSI CMOS image sensors may suffer worse heat emission efficiency when chip size scaling down by process evolution. Worse thermal disposition may induce SNR (Signal to Noise Ratio) performance worse. In order to fit the requirements of SNR, the semiconductor device 100 induces a thermal conductor into the seal ring to improve thermal dissipation ability of the seal ring.

Reference is made back to FIG. 1 and FIG. 2, in which the semiconductor device 100 further includes a thermal conductor 194 formed on the seal ring 130 after the wafer 110 is bonded on the carrier substrate 160. The thermal conductor 194 is formed penetrating the device substrate 170 and connects to the dielectric layer 102. In some embodiments, the thermal conductor 194 penetrates the second passivation layer 182, the first passivation layer 180, and the device substrate 170, and the thermal conductor 194 connects to the upper conductive layer 134 of the seal ring 130. The function of the thermal conductor 194 is different from the function of the electrically conductive pad 150 discussed in FIG. 1. The thermal conductor 194 provides merely thermal dissipation function since the electrically conductive pad 150 is utilized for electrical connection.

In some embodiments, the thermal conductor 194 and the electrically conductive pad 150 can be the same layer. The thermal conductor 194 and the electrically conductive pad 150 are made of processes including one or more deposition and etching processes. In some embodiments, the thermal conductor 194 is made of copper, aluminum, or combinations thereof. The electrically conductive pad 150 is made of substantially the same material as the thermal conductor 194. The thermal conductor 194 can be a continuous structure or a segment structure. The thermal conductor 194 is spatially spaced from and electrically isolated from the electrically conductive pad 150. The projection of the thermal conductor 194 substantially overlaps the projection of the seal ring 130. The thermal conductor 194 is exposed of the second passivation layer 192, and the thermal conductivity of the thermal conductor 194 is greater than that of the device substrate 170 and the passivation layers 180, 182. The thermal conductor 194 can be regarded as an extension of the thermal path of the seal ring 130, such that the thermal exchange area of the seal ring 130 is increased. Therefore, the heat generated from the array region may be dissipated through the seal ring 130 and the thermal conductor 194, in which the thermal conductor 194 formed on the seal ring 130 may improve the thermal dissipation ability of the seal ring 130.

Figure 4:
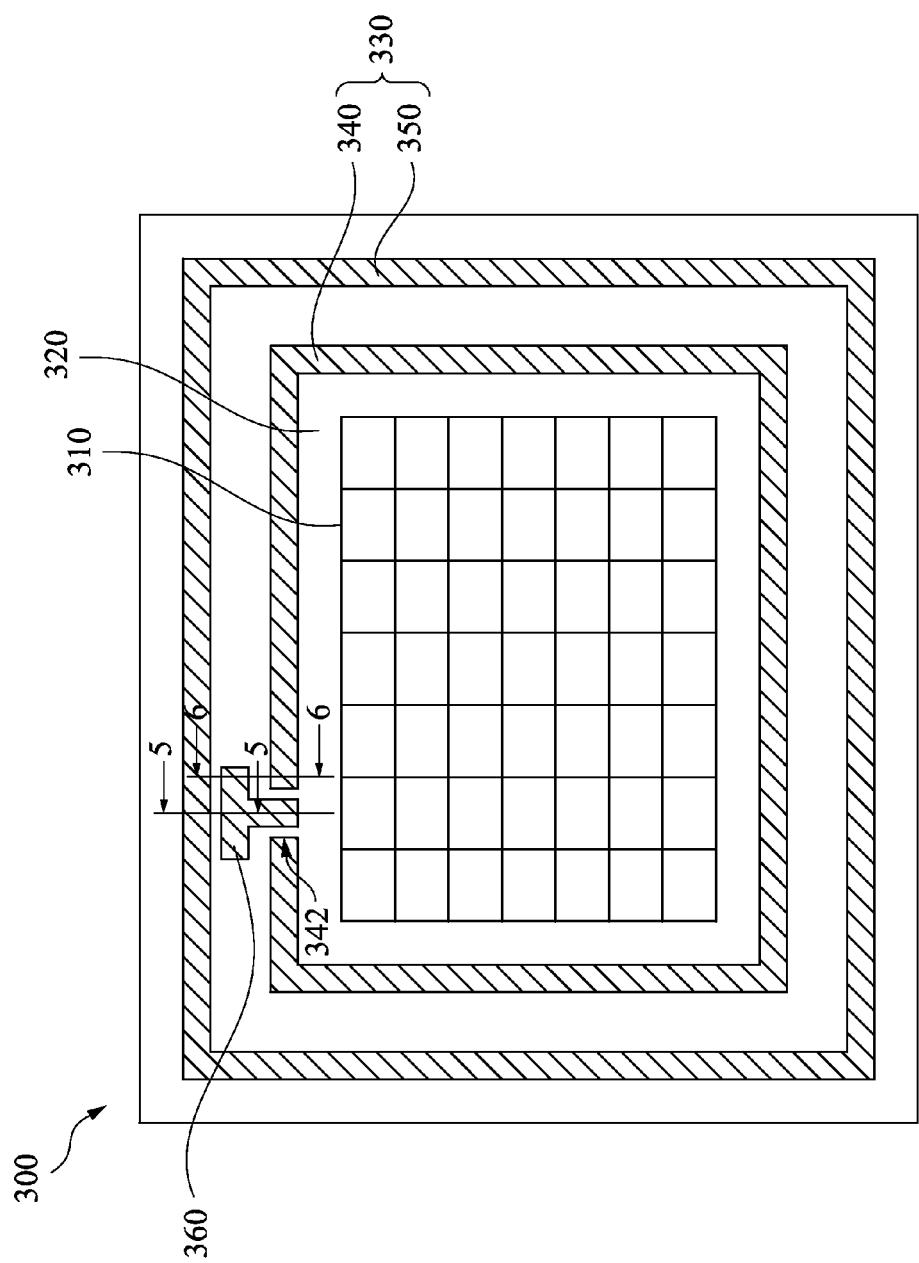
FIG. 4 is a top view of the semiconductor device of some embodiments of the disclosure.
Figure 5:
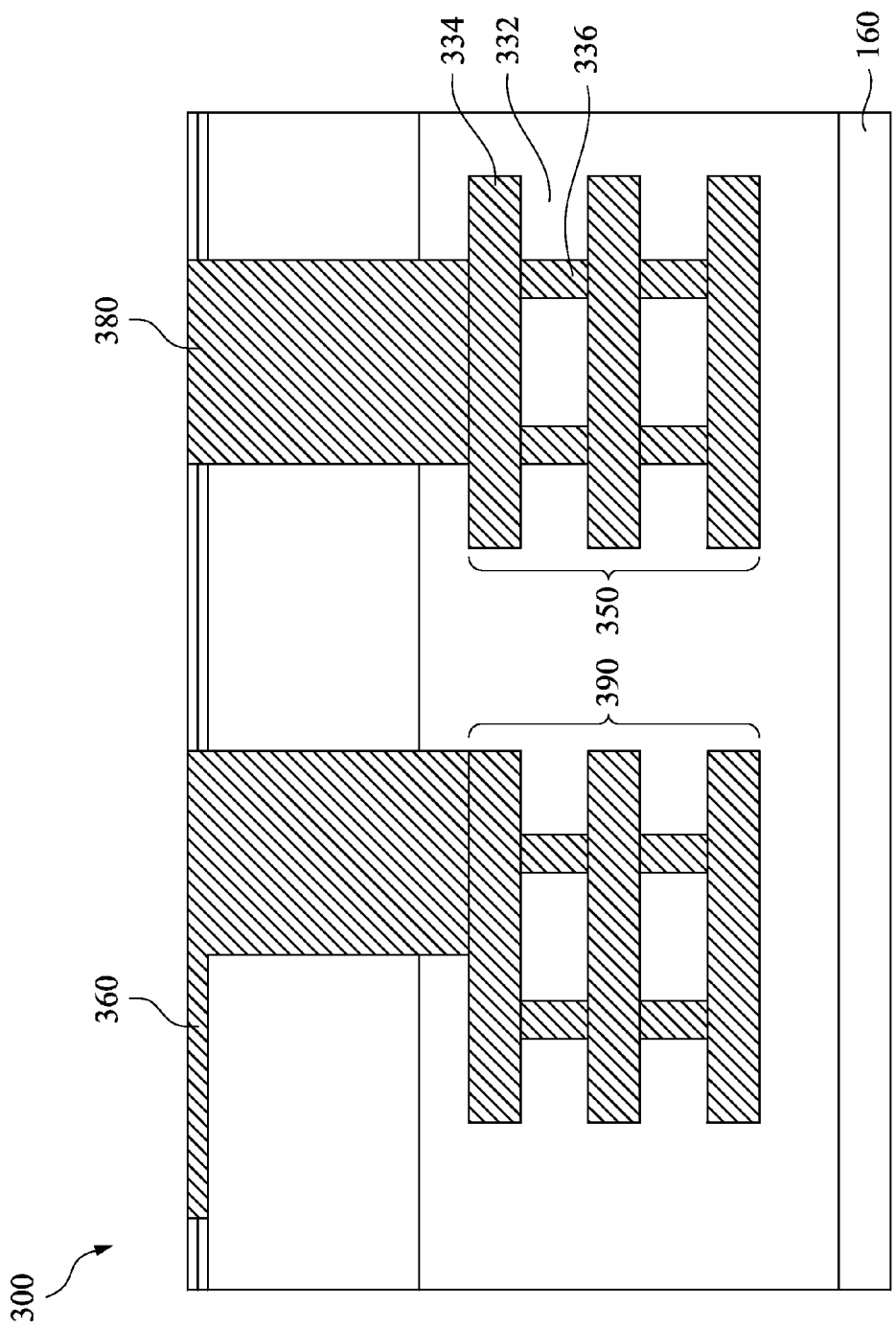
FIG. 5 and FIG. 6 are partial cross-sectional views of different positions of the semiconductor device, in accordance with some embodiments of the disclosure.
Figure 6:
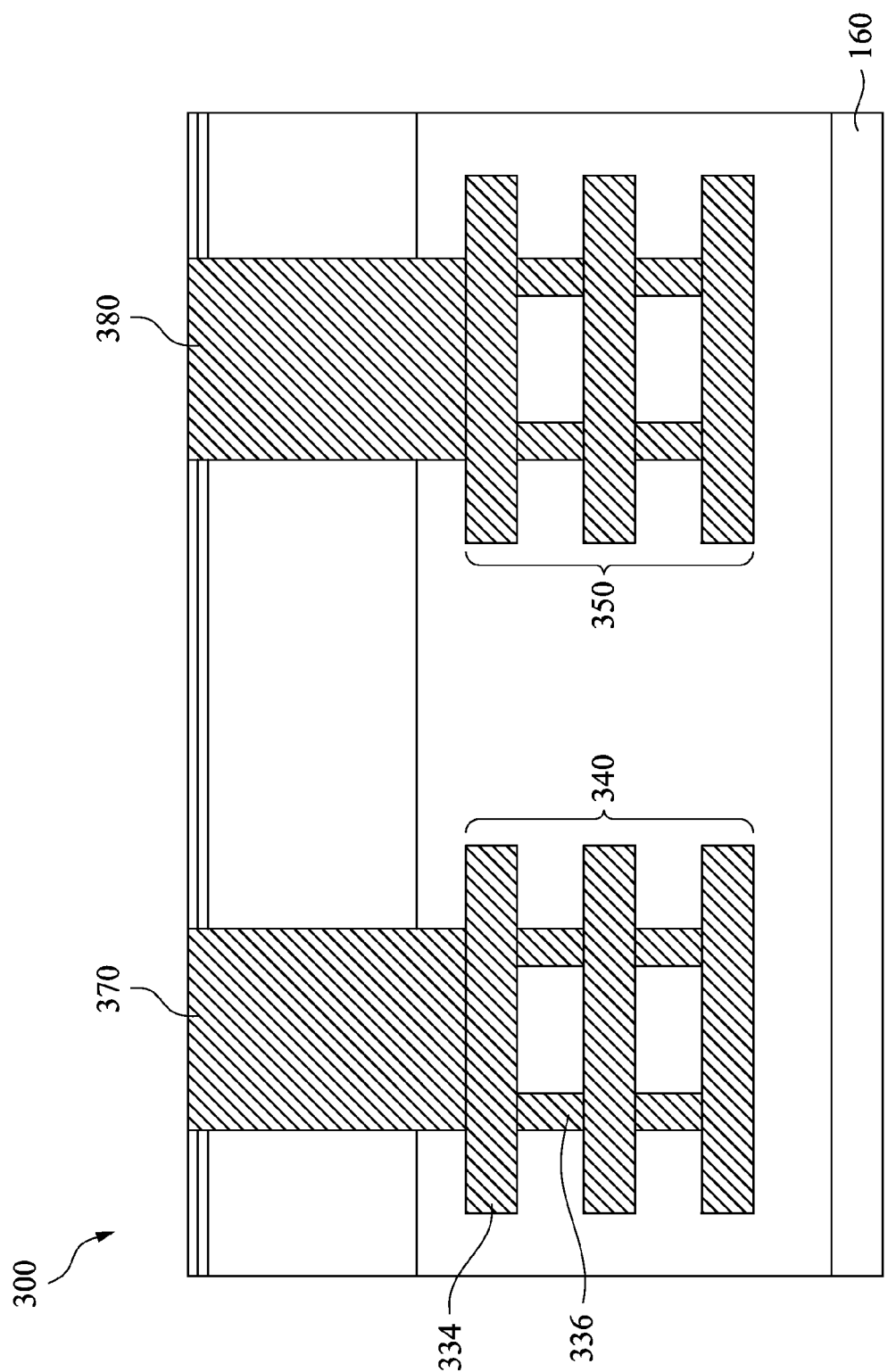

Reference is now made to FIG. 4 to FIG. 6, in which FIG. 4 is a top view of the semiconductor device of some embodiments of the disclosure, FIG. 5 and FIG. 6 are partial cross-sectional views of different positions of the semiconductor device, in which FIG. 5 is taken along line 5-5 of FIG.

4, and FIG. 6 is taken along line 6-6 in FIG. 4. In some embodiments, the semiconductor device 300 includes an array region 310, a periphery region 320, and a seal ring 330. The array region 310 includes multiple semiconductor components. The periphery region 320 is defined between the array region 310 and the seal ring 330. The seal ring 330 can be a dual columns structure, which includes an inner seal ring 340 and an outer seal ring 350. The inner seal ring 340 is arranged between the periphery region 320 and the outer seal ring 350. The semiconductor device 300 includes an electrically conductive pad 360 connecting to array region 310 to connect the array region to a peripheral circuit. The inner seal ring 340 and the outer seal ring 350 are formed of multiple conductive layers 334 and vias 336 for interconnecting the conductive layers 334.

Reference is made to both FIG. 4 and FIG. 5. The electrically conductive pad 360 is formed on an inner-connection structure 390, and the inner-connection structure 390 is electrically connected the inner connecting structure at the array region 310. The electrically conductive pad 360 is formed between the inner seal ring 340 and the outer seal ring 350. The electrically conductive pad 360 is not electrically connected to the seal ring 330. In some embodiments, the electrically conductive pad 360 is spatially spaced from the seal ring 330. For instance, the inner seal ring 340 is designed to have a passage 342 at the position adjacent to the electrically conductive pad 360 for allowing the electrically conductive pad 360 extending through. The inner-connection structure 390 under the electrically conductive pad 360 is not connected to the seal ring 330. In order to protect the components and circuit from being destroyed by the moisture or the oxygen because of the existence of the passage 342 of the inner seal ring 340, the seal ring 330 includes the outer seal ring 350 for completely sealing the array region.

Reference is made to both FIG. 4 and FIG. 6. The array region 310, the periphery region 320, the inner seal ring 340, and the electrically conductive pad 360 are substantially encircled and sealed by the outer seal ring 350. The inner seal ring 340 includes a first portion of the plurality of conductive layers 334. For example, the inner seal ring 340 includes at least some conductive layers 334 and vias 336 formed between the upper conductive layer and the lower conductive layer. The outer seal ring 350 includes a second portion of the plurality of conductive layers 334 substantially adjacent to the first portion. For example, the outer seal ring 350 includes at least some conductive layers 334 and vias 336, substantially adjacent to the inner seal ring 340, formed between the upper conductive layer and the lower conductive layer. The outer seal ring 350 is disposed between the inner seal ring 340 and the die saw cut line. The outer seal ring 350 is not electrically coupled to the array region 310 or the periphery region 320. The outer seal ring 350 is not electronically coupled to the array region 310 because inner seal ring 340 has a relatively higher susceptibility to being affected by conductive debris from sawing because the outer seal ring 350 is disposed relatively closer to the die saw cut line as compared to the inner seal ring 340, for example.

The semiconductor device 300 further includes an inner thermal conductor 370 formed on the inner seal ring 340, and an outer thermal conductor 380 formed on the outer seal ring 350. The electrically conductive pad 360, the inner thermal conductor 370, and the outer thermal conductor 380 are made of the same layer. The inner thermal conductor 370 is spaced from the electrically conductive pad 360. The inner thermal conductor 370 and the outer thermal conductor 380 are connected to the upper conductive layer 334. The inner thermal conductor 370 and the outer thermal conductor 380 are regarded as an extension of the thermal path of the inner seal ring 340 and the outer seal ring 360. Since the inner thermal conductor 370 and the outer thermal conductor 380 are exposed of the surface of the semiconductor device 300, the thermal exchange between the seal ring 330 and the air can be more efficiently. Therefore, the thermal dissipation ability of the seal ring 330 can be improved by inducing the thermal conductors 370 and 380.

Figure 7:
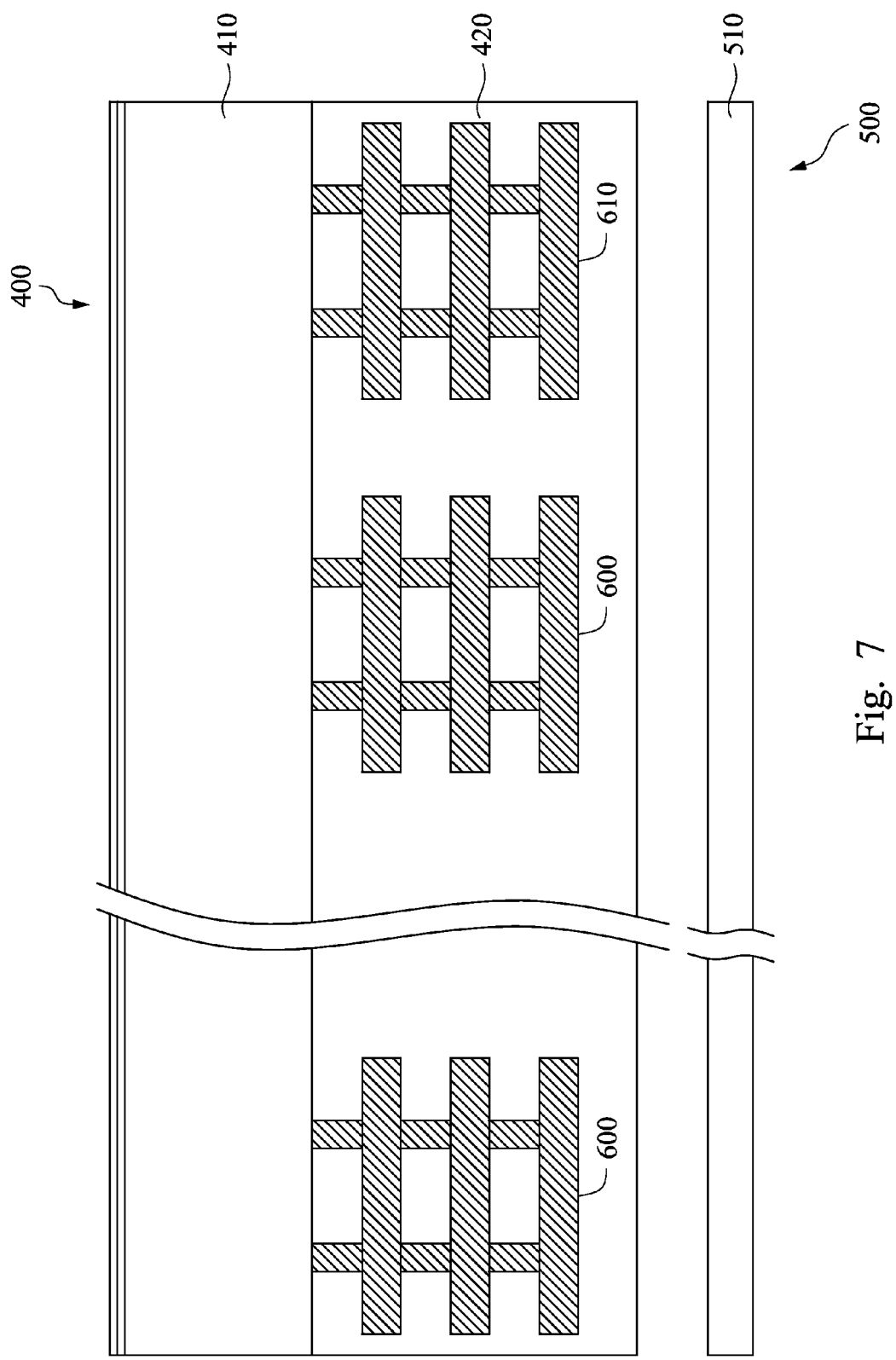
FIG. 7 to FIG. 9 are schematic cross-sectional views of different steps of a method for fabricating the semiconductor device, in accordance with some embodiments of the disclosure.
Figure 8:
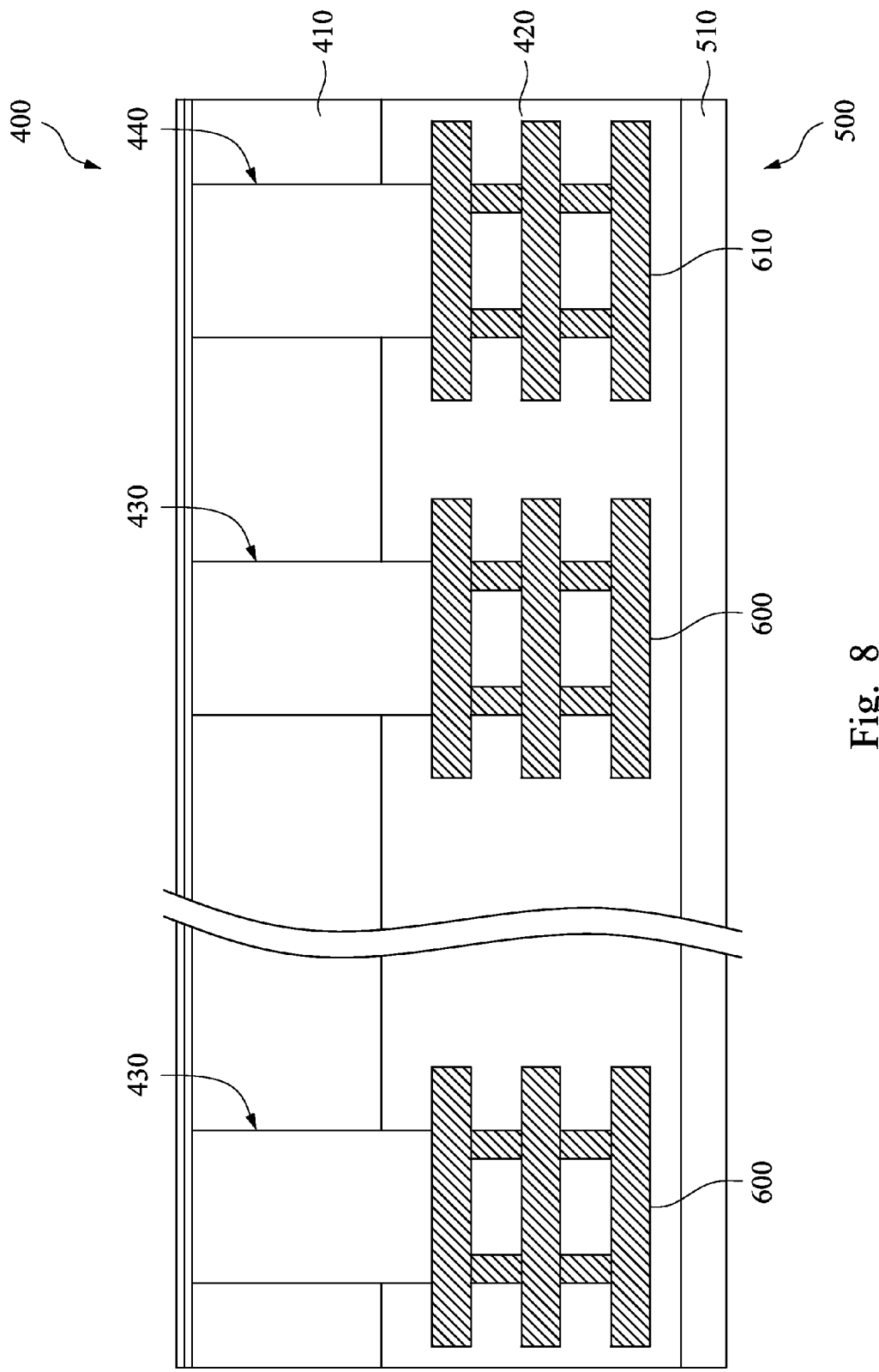
Figure 9:
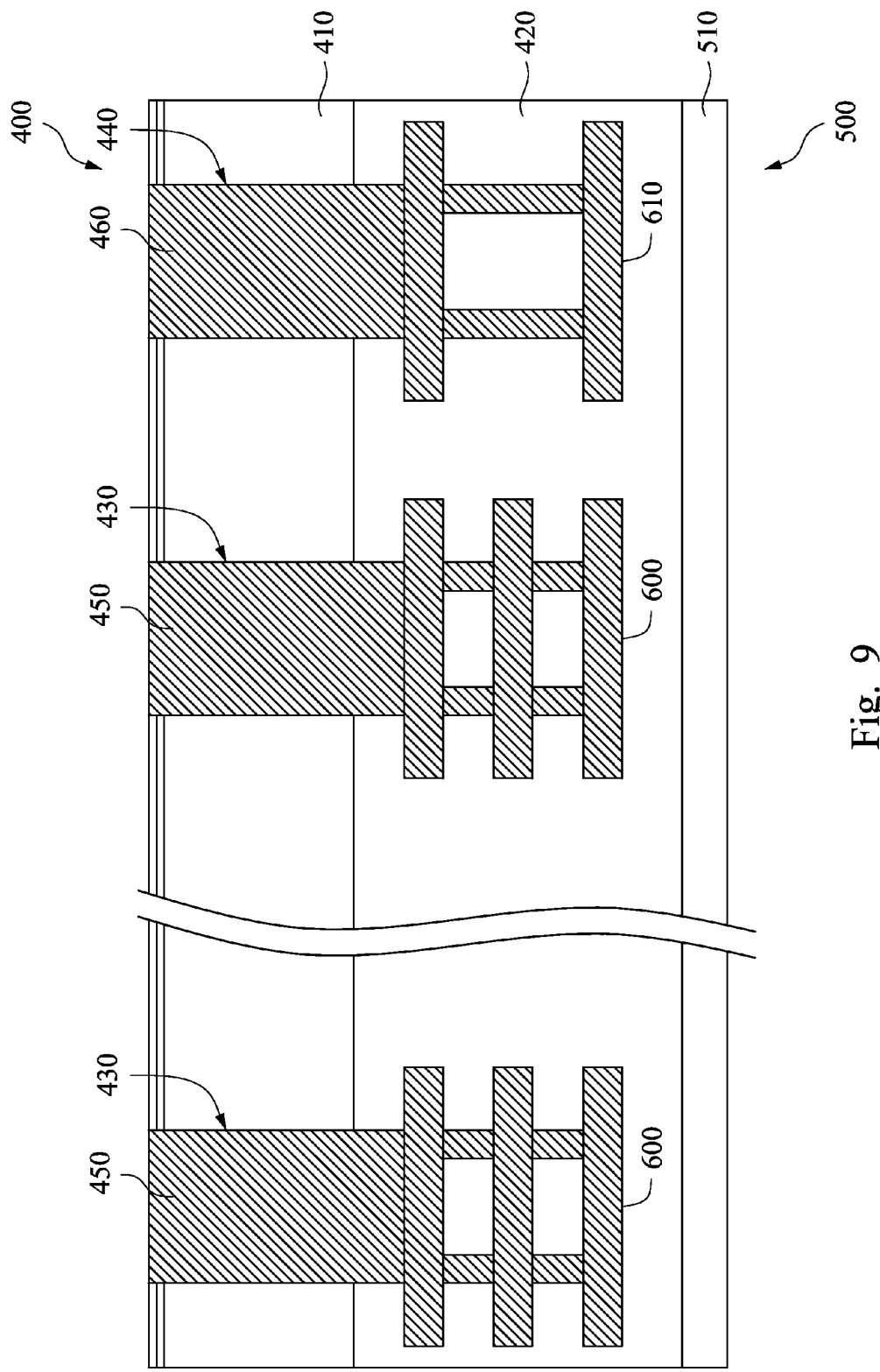

FIG. 7 to FIG. 9 are schematic cross-sectional views of different steps of a method for fabricating a semiconductor device, in accordance with some embodiments of the disclosure. The method begins from FIG. 7, in which a first wafer 400 is bonded onto a second wafer 500. The first wafer 400 may be the wafer including a device substrate 410. The second wafer 500 may be the wafer including a carrier substrate 510. A seal ring 600 is present between the device substrate 410 and the carrier substrate 510. In some embodiments, the first wafer 400 includes a dielectric layer 420 formed on the device substrate 410, and the seal ring 600 is formed embedded in the dielectric layer 420. In some embodiments, the dielectric layer and the seal ring can be formed at the second wafer 500. After the first wafer 400 is bonded onto the second wafer 500, the seal ring 600 is sandwiched between the device substrate 410 and the carrier substrate 510. The device substrate 410 can be similar to any one the device substrates discussed previously. For example, the device substrate 410 includes semiconductor components, such as image sensors, and the semiconductor components are surrounded by the seal ring 600. In some embodiments, an inter-connecting structure 610 is also formed between the device substrate 410 and carrier substrate 510. The inter-connecting structure 610 is formed in the dielectric layer 420, and the inter-connecting structure 610 is electrically connected to the components in the device substrate 410. The seal ring 600 and the inter-connecting structure 610 respectively includes a plurality of conductive layers and vias for connecting the conductive layers.

Referring to FIG. 8, after the first wafer 400 is bonded on the second wafer 500, at least one through hole 430 is formed at least in the device substrate 410 to expose the surface of the seal ring 600. The through hole 430 is formed at the periphery of the device substrate 410. The through hole 430 is formed by performing one or more etching processes.

In some embodiments, the method alternatively includes forming at least one pad opening 440 at least the in the device substrate 410. The pad opening 440 is formed by performing the one or more etching process. The pad opening 440 is formed next the through hole 430, and is not communicated to the through hole 430. The pad opening 440 and the through hole 430 may be formed simultaneously. The pad opening 440 and the through hole 430 may be formed using the same mask. In some embodiments, the upper vias of the seal ring 600 and the inter-connecting structure 610 are also removed to expose the upper conductive layer.

Referring to FIG. 9, a conductive material is deposited and fills the pad opening 440 and the through hole 430, and the portion of the conductive material above the first wafer 400 is removed. The remaining portions of the conductive material form a thermal conductor 450 in the through hole 430, and an electrically conductive pad 460 in the pad opening 440. The conductive material can be aluminum, copper, or combinations thereof. The thermal conductor 450 is thermally connected to the seal 600 ring through the through hole 430 for thermal dissipation. The electrically conductive pad 460 is electrically connected to the interconnecting structure 610. In some embodiments, the thermal conductor 450 directly couples to the upper conductive layer of the seal ring 600, and the electrically conductive pas 460 directly couples to the upper conductive layer of the interconnecting structure 610.

The semiconductor device includes a thermal conductor formed on and thermally connected to the seal ring. The thermal conductor is spatially spaced from a electrically conductive pad. The thermal conductor is exposed of the substrate and can be regarded as an extension of the thermal path of the seal ring, such that the heat from the seal ring is dissipated efficiently.

According to some embodiments, a semiconductor device includes a first substrate, at least one dielectric layer present on the first substrate, at least one first seal ring present in the dielectric layer, a second substrate present on the dielectric layer, and at least one first thermal conductor present in the second substrate and thermally connected to the first seal ring, wherein the first thermal conductor is exposed from a surface of the second substrate.

According to some embodiments, a semiconductor device includes a carrier substrate, a device substrate having at least one through hole therein, an image sensor present in the device substrate, at least one dielectric layer present between the carrier substrate and the device substrate, at least one seal ring present in the dielectric layer and surrounding the image sensor, and at least one thermal conductor present in the through hole and in a thermal contact with the seal ring.

According to some embodiments, a method for manufacturing a semiconductor device includes bonding a first wafer onto a second wafer, wherein the first wafer has a first substrate and the second wafer has a second substrate, and at least one seal ring is present between the first substrate and the second substrate; forming at least one through hole at least in the first substrate; and forming at least one thermal conductor thermally connected to the seal ring through the through hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first substrate;
at least one dielectric layer present on the first substrate;
at least one first seal ring present in the dielectric layer;
a second substrate present on the dielectric layer;
at least one first thermal conductor present in the second substrate and thermally connected to the first seal ring, wherein the first thermal conductor is exposed from a surface of the second substrate;
at least one second seal ring present in the dielectric layer, wherein the first seal ring is surrounded by the second seal ring; and
at least one second thermal conductor present in the second substrate and thermally connected to the second seal ring, wherein the second thermal conductor is exposed from the surface of the second substrate, the first thermal conductor comprises an opening, and the second thermal conductor is continuous.

2. The semiconductor device of claim 1, further comprising:
at least one image sensor present in the second substrate and surrounded by the first seal ring.

3. The semiconductor device of claim 1, wherein the first thermal conductor is made of copper, aluminum, or combinations thereof.

4. The semiconductor device of claim 1, further comprising:
at least one semiconductor component present in the second substrate;
an inter-connecting structure present in the dielectric layer and electrically connected to the semiconductor component; and
an electrically conductive pad present in the second substrate and electrically connected to the inter-connecting structure.

5. The semiconductor device of claim 4, wherein the electrically conductive pad is spatially spaced from the first seal ring.

6. The semiconductor device of claim 4, wherein the electrically conductive pad and the first thermal conductor are made of substantially the same material.

7. The semiconductor device of claim 1, further comprising:
a passivation layer present on the surface of the second substrate, wherein the first thermal conductor is further exposed from the passivation layer.

8. The semiconductor device of claim 2, further comprising a plurality of image sensors, which include the image sensor, in the second substrate and arranged in an array.

9. The semiconductor device of claim 2, wherein the image sensor is a complementary metal oxide image sensor.

10. The semiconductor device of claim 4, wherein the electrically conductive pad passes through the opening.

11. The semiconductor device of claim 1, wherein the second thermal conductor is made of copper, aluminum, or combinations thereof.

12. The semiconductor device of claim 1, wherein the first seal ring comprises a plurality of conductive layers and a plurality of vias coupling the conductive layers.

13. The semiconductor device of claim 1, wherein the second seal ring comprises a plurality of conductive layers and a plurality of vias coupling the conductive layers.

14. A semiconductor device comprising:
a carrier substrate;
a device substrate having at least one through hole therein;
an image sensor present in the device substrate;
at least one dielectric layer present between the carrier substrate and the device substrate;
at least one seal ring present in the dielectric layer and surrounding the image sensor;
an electrically conductive pad present in the device substrate and electrically connected to the image sensor; and
at least one thermal conductor present in the through hole and in a thermal contact with the seal ring, wherein the thermal conductor has an opening for allowing the electrically conductive pad to pass through the thermal conductor.

15. The semiconductor device of claim 14, wherein the thermal conductor is made of copper, aluminum, or combinations thereof.

16. The semiconductor device of claim 14, further comprising an inter-connecting structure present in the dielectric layer, wherein the image sensor comprises:
- an optical structure present on the device substrate; and
- a photodiode present in the device substrate and electrically connected to the inter-connecting structure.

17. The semiconductor device of claim 14, wherein the thermal conductor is exposed from a surface of the device substrate.

18. The semiconductor device of claim 14, further comprising a first passivation layer present on the device substrate, wherein the first passivation layer and the dielectric layer are present at opposite sides of the device substrate.

19. The semiconductor device of claim 18, further comprising a second passivation layer, wherein the first passivation layer is present between the second passivation layer and the device substrate, and the first passivation layer and the second passivation layer are made of different materials.

20. The semiconductor device of claim 18, wherein a thermal conductivity of the thermal conductor is greater than that of the device substrate and the first passivation layer.

* * * * *